United States Patent [19]

Jaffe et al.

[11] 3,715,636

[45] Feb. 6, 1973

[54] SILICON CARBIDE LAMP MOUNTED ON A CERAMIC OF POOR THERMAL CONDUCTIVITY

[75] Inventors: Mary S. Jaffe, Cleveland Heights; Ralph M. Potter, Pepper Pike, both of Ohio

[73] Assignee: General Electric Company

[22] Filed: Jan. 3, 1972

[21] Appl. No.: 215,069

[52] U.S. Cl.........317/234 R, 317/235 N, 317/234 N, 317/234 G, 317/234 D, 317/237

[51] Int. Cl............H01l 15/00, H01l 1/02, H01l 1/10

[58] Field of Search.......317/235 N, 234 G, 234 N, 317/234 D, 317/237

[56] References Cited

UNITED STATES PATENTS

| | | | |
|---|---|---|---|
| 3,598,666 | 8/1971 | Addmiano | 148/187 |
| 3,602,777 | 8/1971 | Berman | 317/234 R |
| 3,059,158 | 10/1962 | Doucetti | 317/234 |
| 3,458,779 | 7/1969 | Blank | 317/234 |
| 3,611,064 | 10/1971 | Hall | 317/234 R |
| 3,517,281 | 6/1970 | Mlavsky | 317/237 |
| 3,641,390 | 2/1972 | Nakamura | 315/169 |
| 3,629,670 | 12/1971 | Perusek | 317/237 |
| 3,573,568 | 4/1971 | Siegel | 317/234 |
| 3,629,011 | 12/1971 | Tohi | 148/1.5 |
| 3,462,321 | 8/1969 | Vitkus | 148/172 |

*Primary Examiner*—Martin H. Edlow
*Attorney*—Norman C. Fulmer et al.

[57] ABSTRACT

A boron-doped silicon carbide light-emitting diode chip is mounted, such as on a support member of porous ceramic or other material of similarly low thermal conductivity, so as to operate at a temperature of at least 150°C. Such a construction increases the amount of light produced by the boron-doped silicon carbide diode, due to increased operating temperature. A cover is placed over the diode to prevent convection cooling, thus further increasing the operating temperature and hence the light output. Instead of boron doping, the silicon carbide diode can be doped with other materials that produce similarly deep acceptor levels.

16 Claims, 4 Drawing Figures

SILICON CARBIDE LAMP MOUNTED ON A CERAMIC OF POOR THERMAL CONDUCTIVITY

BACKGROUND OF THE INVENTION

The invention is in the field of solid state lamps employing silicon carbide PN junction diodes.

Various semiconductor materials can be processed to provide PN junctions which will produce light (visible or infrared) when current is passed through the junction. Materials such as gallium arsenide, gallium phosphide, silicon carbide, zinc sulfide, germanium, aluminum nitride, gallium nitride, and other Group III-V and Group II-VI compounds, have been or can be used in fabricating PN junction diodes suitable for producing light. In one type of process, wafers or crystals of suitable semiconductor material are treated by "doping" them with other materials for forming a PN junction in each wafer, and the wafers are then sliced or diced to provide numerous individual PN junction diodes of small size such as about one millimeter square and a fraction of a millimeter in thickness. Each individual diode is suitably mounted and electrically connected into a solid state lamp assembly. The individual diodes can be mounted in various ways, such as by encapsulation in glass or clear plastic, or by bonding to a "header" support member of metal, glass or plastic.

Although PN junction light-emitting diodes are low-power devices, they generate a certain amount of heat due to the current flow through inherent internal electrical resistance and voltage drop in the diode, and therefore it has been desirable to provide some cooling in order to reduce the diode's operating temperature and achieve greater efficiency of light production. This has been achieved in various ways, such as by mounting the diode in a manner to be exposed to air (for convection cooling) or by mounting it on a thermally conducting support of metal, or a glass or plastic having a certain degree of thermal conductivity, or by providing a flow of liquid coolant. U.S. Pat No. 3,458,779 to Blank and Potter, describes a construction wherein a light-emitting diode is mounted on a metal header which functions as a "heat-sink" to provide cooler operation of the diode. U.S. Pat. Nos. 3,290,539 to Lamorte and 3,508,100 to Tillays describe solid state lamp constructions which provide a flow of liquid coolant past the diode for reducing its operating temperature.

SUMMARY OF THE INVENTION

Objects of the invention are to provide an improved silicon carbide lamp construction, and to provide such a construction which will generate more light, and with greater efficiency, than has been achieved heretofore.

The invention comprises, briefly and in a preferred embodiment, a boron-doped silicon carbide light-emitting diode having a PN junction, and means for mounting the diode on a support member of porous ceramic or other material of similarly low thermal conductivity, such as to cause increased heating of the diode when operating current is passed through its junction, whereby the light output and efficiency of the diode is increased. The diode may be mounted as just described, or in other ways, to provide sufficient thermal insulation so that the normal operating current will raise its operating temperature to 150°C or greater. Further improvement may be obtained by placing a cover over the diode to prevent convection cooling by air currents, and the confined space around the diode may be filled with argon or other relatively dense inert gas, or may be a vacuum.

PREFERRED EMBODIMENTS OF THE INVENTION

Figure 1:
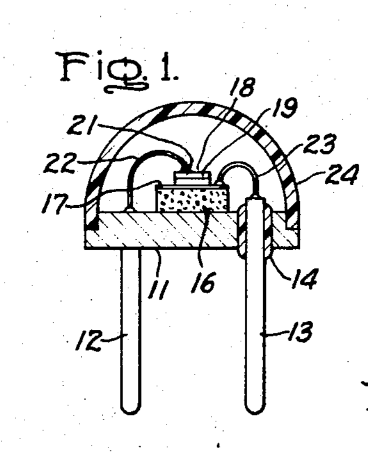
FIG. 1 is a side cross-sectional view of a solid state lamp construction in accordance with a preferred embodiment of the invention.

In the construction of FIG. 1, a header 11, which may be a circular disc of metal such as Kovar, is provided with a first connection lead wire or post 12 attached thereto and extending downwardly therefrom. A second connection lead wire or post 13 is positioned parallel to the first lead 12, and extends through an opening in the header 11 and is electrically insulated therefrom by insulation means 14 of glass, plastic or other suitable material. The header and lead construction thus far described is similar to that shown and described in the above-referenced Blank and Potter patent. A small block 16 of porous ceramic or other material having similarly low thermal conductivity, is attached to the top surface of the header 11, centrally thereof, by suitable means such as cement or solder. A metallic layer 17 is provided on the top surface of the mounting block 16, and may comprise gold, silver, or other suitable metal which has been evaporated or otherwise provided on the top surface of the block 16. A boron-doped silicon carbide light-emitting diode 18, containing a PN junction 19, is attached (preferably P-type side down) on the metallic layer 17, preferably by means of gold soldering. An ohmic contact connection is made to top surface of the diode 18, and is connected by means of a fine gold wire 22 to the header 11 by means of soldering or compression bonding, or other suitable means. Another fine gold wire 23 is electrically connected between the metallic layer 17 on the mounting block 16, and the upper end of the second terminal lead 13. The aforesaid silicon carbide diode 18, and the contact 21 thereto, may be as described in the above-referenced Blank and Potter patent. A cover 24, which may be of hollow hemispherical shape and formed from glass or plastic, is positioned, over and around the diode 18 and support block 16, and is attached at the rim thereof to the rim of the header 11. If desired, the space defined by the cover 24 and header 11 may be evacuated, or, instead, may be filled with an inert gas having low thermal conductivity, such as argon.

The principal concept of the invention is the discovery that silicon carbide light-emitting diodes prepared by diffusion of boron and aluminum into a n-type silicon carbide, for instance, as described in U.S. Pat. No. 3,458,779 to Potter and Blank, unlike other light-emitting diodes, produce brighter light, and at higher efficiency, when operated at high temperature such as 150°C or higher, whereas the other types of light-emitting diodes operate the most brightly and at greatest efficiency when efforts are made to keep the operating temperature cooler than is the case with the construction of the present invention. By mounting the silicon carbide light-emitting diode 18 on a block of porous ceramic or other material having similarly good thermal insulating qualities, electrical power dissipated by current flowing through the internal resistance of the diode and the voltage drop of the junction, when voltage is applied across the terminal leads 12 and 13, causes the diode to heat to a temperature of 150°C or greater at normal operating current, whereby improved brightness and efficiency are obtained. By adding the cover 24, and further by supplying a vacuum or suitable inert gas within the space around the diode 18, convection cooling by air currents is prevented, thus permitting the diode to reach a warmer operating temperature. Preferably, the structure of the invention, together with the operating current passed through the lamp, is such as to cause the diode to operate at a temperature of at least 150°C.

The following table lists operating parameters that have been ascertained for a boron-and-aluminum-doped lamp constructed in accordance with the invention as shown in FIG. 1 (but without the cover 24), and for a similar silicon carbide diode (taken from the same production batch) mounted on a metal header, with a current of 50 milliamperes being passed through the diodes:

| | Thermally insulated | On bare header |
|---|---|---|
| Brightness (fL) | 47 | 29 |
| Voltage | 3.14 | 3.84 |
| Power (mW) | 166 | 192 |
| Efficiency (l/w) | .0015 | .0008 |
| Temperature °C | 153° | 117° |

Figure 4:
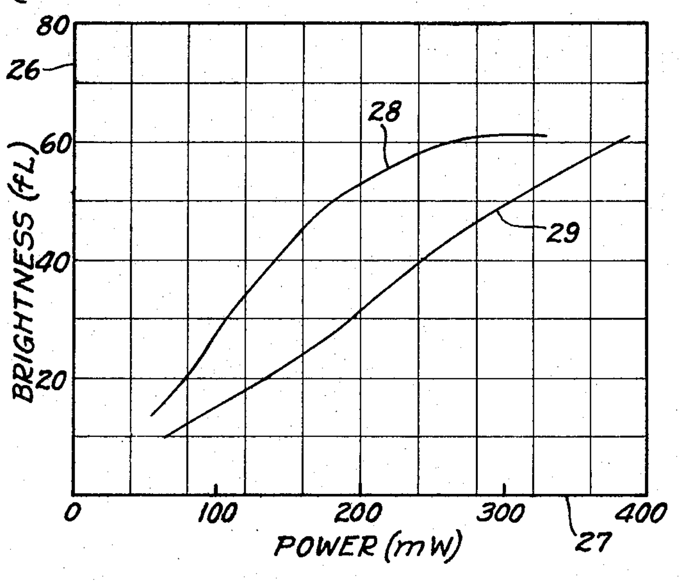
FIG. 4 is a graph showing the improved brightness obtained from a lamp made in accordance with the invention, as compared with a previous lamp construction.

In the graph of FIG. 4, the vertical axis 26 represents brightness in footlamberts, and the horizontal axis 27 represents power in milliwatts supplied into the diode. Curve 28 represents the brightness (in footlamberts) of light output from a boron-doped silicon carbide diode, versus input power in milliwatts, for a lamp constructed in accordance with the invention and as shown in FIG. 1 (but without the cover 24), and the curve 29 shows brightness versus input power, for a similar silicon carbide diode mounted on a metal header in accordance with the prior art. From these curves, and from the above comparison table, it will be seen that the lamp constructed in accordance with the invention has an improvement of 64 percent in brightness and 88 percent in efficiency, over the lamp mounted on a metal header.

Figure 2:
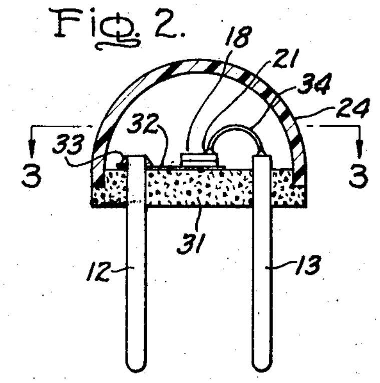
FIG. 2 is a side cross-sectional view of an alternative embodiment of the invention.
Figure 3:
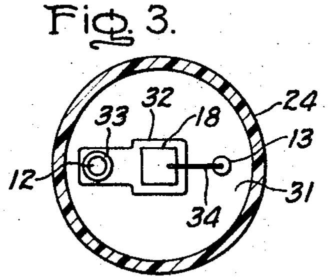
FIG. 3 is a cross-sectional view taken on the line 3—3 of FIG. 2.

In the alternative embodiment of FIGS. 2 and 3, the header 31 is made from porous ceramic or other material of equally good thermal insulation properties, and the first and second terminal leads 12 and 13 extend through openings in the header 31, and are fastened thereto by force fit or by cementing, or other means. A small, thin metallic connection platform 32 is formed from gold or other metal evaporated or otherwise deposited on a portion of the upper surface of the header 31, as shown, and the first lead 12 extends through this metal layer and is soldered thereto at 33. The boron-doped silicon carbide light-emitting diode 18 is soldered or otherwise attached to the metallic support layer 32 near the center of the header 31, and a fine gold wire 34 is attached between a point contact connection 21 on the diode 18, and the upper end of the second terminal lead 13. Thus, a current path is provided through the diode 18, between the terminal leads 12 and 13, via the metallic platform 32 and the fine gold wire 34. A cover 24 may be placed over and around the diode 18, and attached to the rim of the header 31, and the space enclosed thereby filled with vacuum or gas, as described above with reference to FIG. 1.

Suitable materials for the porous ceramic mounting block, or mounting header, are found to be that known in the trade as "Jerrill low fired porous ceramic," or other foamed ceramic or foamed glass. Also, the support may be made from lightly compacted asbestos, or ceramic or glass in the form of fibers, spheres, flakes, or granules, or in the form of hollow-sphere "microballoons." The mounting block should be thick enough to provide substantially full benefit of its thermal insulation qualities. The type of light-emitting diodes with which the invention achieves improved light output and efficiency, is silicon carbide PN junction diodes doped with boron or other element which produces a similarly deep acceptor energy level; i.e., producing an acceptor level with a relatively great hole ionization energy. Other dopants such as aluminum can be added if desired.

While preferred embodiments of the invention have been shown and described, other embodiments and modifications thereof will become apparent to persons skilled in the art, and will fall within the scope of invention as defined in the following claims.

What we claim as new and desire to secure by Letters Patent of the United States is:

1. A silicon carbide lamp construction comprising a silicon carbide light-emitting diode having a PN junction formed with one or more dopants including boron or other element which produces a similarly deep acceptor level, said PN junction being between and substantially parallel to two surfaces of the diode, a support member of porous ceramic or other material of similarly low thermal conductivity, means mounting said diode on said support member, and means making a pair of electrical connections to said diode at opposite sides of the PN junction so that current can be made to flow through said PN junction.

2. A lamp construction as claimed in claim 1, including means providing an enclosed space surrounding said diode to reduce convection cooling of the diode.

3. A lamp construction as claimed in claim 2, in which said enclosed space comprises a vacuum.

4. A lamp construction as claimed in claim 2, in which said enclosed space is filled with argon or other inert gas providing a degree of thermal insulation at least as great as argon.

5. A lamp construction as claimed in claim 1, including current supply means connected to said electrical connections and supplying an amount of operating current through said diode so as to cause the diode to heat to an operating temperature of at least 150°C.

6. A lamp construction as claimed in claim 1, in which one of said electrical connections to the diode comprises a metal layer provided on a surface of said support member, means attaching said diode at one of said surfaces thereof to said metal layer, said metal layer being of larger area than that of said diode whereby a portion of said metal layer extends laterally from said one surface of the diode, and means making electrical connection to said laterally extending portion of the metal layer.

7. A lamp construction as claimed in claim 6, including a metal header provided with a first connector lead attached thereto and extending therefrom and a second connector lead positioned substantially parallel to said first connector lead and extending through an opening in said header to the upper surface thereof and electrically insulated therefrom, said support member having a bottom surface and a top surface, means attaching said support member at the bottom surface thereof to said upper surface of the header, said metal layer being provided on said top surface of the support member, means electrically connecting one of said connector leads to said laterally extending portion of the metal layer thereby making electrical connection to the bottom surface of said diode, and means electrically connecting the other one of said connector leads to the top surface of said diode.

8. A lamp construction as claimed in claim 7, including a light-transparent cup-like cover member positioned over and around said diode and attached at the rim thereof to said header.

9. A lamp construction as claimed in claim 8, in which said header and cover member define an enclosed space, said enclosed space being evacuated.

10. A lamp construction as claimed in claim 8, in which said header and cover member define an enclosed space, said enclosed space being filled with argon or other inert gas providing a degree of thermal insulation at least as great as argon.

11. A lamp construction as claimed in claim 6, in which said support member has substantially mutually parallel top and bottom surfaces and constitutes a header, said metal layer being provided on said top surface of the header, first and second mutually parallel connector leads positioned through vertical openings through said header and extending downwardly therefrom, the top portion of the first of said connector leads being in electrical contact with said metal layer thereby making electrical connection to the bottom surface of said diode, and means electrically connecting the top portion of said second connector lead to the top surface of said diode.

12. A lamp construction as claimed in claim 11, including a light-transparent cup-like cover member positioned over and around said diode and attached at the rim thereof to said header.

13. A lamp construction as claimed in claim 12, in which said header and cover member define an enclosed space, said enclosed space being evacuated.

14. A lamp construction as claimed in claim 12, in which said header and cover member define an enclosed space, said enclosed space being filled with argon or other inert gas providing a degree of thermal insulation at least as great as argon.

15. A silicon carbide lamp construction comprising a silicon carbide light-emitting diode having a PN junction formed with one or more dopants including boron or other element which produces a similarly deep acceptor level, said diode being designed for operation with a given value of operating current flow through said PN junction, said diode having the characteristic of producing heat in response to said operating current flow, and mounting means for supporting and making electrical connections to said diode, said mounting means providing sufficient thermal insulation for said diode so as to cause said heat produced by the operating current flow to raise the operating temperature of said diode to at least 150°C.

16. A lamp construction as claimed in claim 15, in which said mounting means comprises a support member of porous ceramic or other material of similarly low thermal conductivity.

* * * * *